(12) United States Patent
Bivens et al.

(10) Patent No.: US 8,560,922 B2
(45) Date of Patent: Oct. 15, 2013

(54) BAD BLOCK MANAGEMENT FOR FLASH MEMORY

(75) Inventors: John A. Bivens, Ossining, NY (US); Michele M. Franceschini, White Plains, NY (US); Ashish Jagmohan, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 13/040,531

(22) Filed: Mar. 4, 2011

(65) Prior Publication Data

US 2012/0226963 A1 Sep. 6, 2012

(51) Int. Cl.
*G11C 29/00* (2006.01)

(52) U.S. Cl.
USPC .......................................... 714/763; 714/773

(58) Field of Classification Search
USPC ................................. 714/773, 763
See application file for complete search history.

(56) References Cited

U.S. PATENT DOCUMENTS

| | | | |
|---|---|---|---|
| 5,452,429 A * | 9/1995 | Fuoco et al. | 714/6.1 |
| 5,787,445 A | 7/1998 | Daberko | |
| 6,697,976 B1 * | 2/2004 | Satoh et al. | 714/704 |
| 7,171,536 B2 | 1/2007 | Chang et al. | |
| 7,296,128 B2 | 11/2007 | Lee | |
| 7,441,067 B2 | 10/2008 | Gorobets et al. | |
| 7,453,723 B2 | 11/2008 | Radke | |
| 7,466,597 B2 | 12/2008 | Kim | |
| 2004/0196707 A1 | 10/2004 | Yoon et al. | |
| 2006/0106972 A1 | 5/2006 | Gorobets et al. | |
| 2007/0180328 A1 | 8/2007 | Cornwell et al. | |
| 2007/0198786 A1 | 8/2007 | Bychkov et al. | |
| 2008/0091872 A1 | 4/2008 | Bennett et al. | |
| 2008/0307270 A1 | 12/2008 | Li | |
| 2010/0241928 A1 * | 9/2010 | Kim et al. | 714/763 |
| 2012/0079355 A1 * | 3/2012 | Patapoutian et al. | 714/780 |

FOREIGN PATENT DOCUMENTS

| | | |
|---|---|---|
| EP | 2015310 A2 | 1/2009 |
| EP | 2077559 A2 | 7/2009 |

OTHER PUBLICATIONS

C. Park et al., "A Low Cost Memory Architecture with NAND XIP for Mobile Embedded Systems", International Symposium on Systems Synthesis, Proceedings of the 1st IEEE/ACM/IFIP International Conference on Hardware/Software Codesign and System Synthesis, pp. 138-143; Year of Publication 2003.
C. Park et al., "A Reconfigurable FTL (Flash Translation Layer) Architecture for NAND Flash-Based Applications"; ACM Transactions on Embedded Computing Systems (TECS) archive, vol. 7, Issue 4 (Jul. 2008).
Neal Mielke et al.; "Bit Error Rate in NAND Flash Memories"; IEEE CFP08RPS-CDR 46 Annual International Reliability Physics Symposium; Phoenix, 2008 pp. 9-19.
Te-Hsuan Chen et al.; "An Adaptive-Rate Error Correction Scheme for NAND Flash Memory"; Downloaded on Apr. 1, 2010 from IEEE Xplore; pp. 53-58.

* cited by examiner

*Primary Examiner* — M. Mujtaba K Chaudry
(74) *Attorney, Agent, or Firm* — Cantor Colburn LLP; Dwayne Nelson

(57) ABSTRACT

Bad block management for flash memory including a method for storing data. The method includes receiving a write request that includes write data. A block of memory is identified for storing the write data. The block of memory includes a plurality of pages. A bit error rate (BER) of the block of memory is determined and expanded write data is created from the write data in response to the BER exceeding a BER threshold. The expanded write data is characterized by an expected BER that is lower than the BER threshold. The expanded write data is encoded using an error correction code (ECC). The encoded expanded write data is written to the block of memory.

22 Claims, 8 Drawing Sheets

| | | | | | | |
|---|---|---|---|---|---|---|
| L0 | L0 | L0 | | L3 | L3 | L3 |
| L0 | L0 | L0 | ... | L3 | L3 | L3 |
| L0 | L0 | L0 | | L3 | L3 | L3 |

500

| | | | |
|---|---|---|---|
| b | b | b | |
| b | a | b | $a \in \{L0, ..., L3\}$ |
| b | b | b | $b \in \{L0, ..., L3\}$ |

BAD BLOCK MANAGEMENT FOR FLASH MEMORY

BACKGROUND

The present invention relates generally to computer memory, and more specifically to bad block management in not-and (NAND) flash memory.

Phase-change memories (PCMs) and flash memories are examples of non-volatile memories with limited endurance (also referred to as a "limited life"). Such memories have limited endurance in the sense that after undergoing a number of writing cycles (RESET cycles for PCM, program/erase cycles for flash memory), the memory cells wear out and may no longer be able to reliably store information. In addition, flash memory may be affected by errors in surrounding pages that are introduced while writing data to a page. These types of errors are referred to as disturbance errors.

Contemporary not-and (NAND) flash memory devices do not support page level erases. The absence of page erases implies that once a page is written, it cannot be rewritten until the entire block (e.g., made up of sixty-four pages) is erased. If a logical address corresponding to a page requires refreshing, this is accomplished by marking the page as invalid and mapping the logical block address to a different physical page. Disturbance errors, however, may cause the bits of the erased pages to appear to be written (e.g., changed from '1' to '0' for single-level cell flash). Because individual pages cannot be erased, disturbance errors in blank pages may cause faulty values in data that is subsequently written to those pages.

In addition, disturbance errors in memory may affect previously written pages by flipping bits from the programmed value to a new value. Typically these errors are undetectable and only manifest themselves once the data is read from memory.

Cells in NAND flash (also referred to as memory) suffer from the problem of wear, wherein the cell tunnel oxide becomes increasingly defective with program/erase cycles and the associated charge flow through the oxide is altered. The result of the cell tunnel oxide is that some cells may become unable to hold a charge, or, may be only able to hold a charge for a short retention time. When enough defective or low-retention cells exist in a block of memory, the error rate in the block of memory may become high enough that data written in the block cannot support a required level of reliability. Due to physical non-uniformities in the memory, different blocks may go "bad" at different times. Certain blocks of memory may even be bad when the device is new.

Conventional solutions to the problem of managing bad blocks involve the detection of bad blocks using various statistics such as block bit error rate (BER), followed by decommissioning blocks which do not meet reliability requirements, and in some cases, replacing them with spare blocks.

SUMMARY

An embodiment is a computer implemented method for storing data. The method includes receiving a write request that includes write data. A block of memory is identified for storing the write data. The block of memory includes a plurality of pages. A bit error rate (BER) of the block of memory is determined and the expanded write data is created from the write data in response to the BER exceeding a BER threshold. The expanded write data is characterized by an expected BER that is lower than the BER threshold. The expanded write data is encoded using an error correction code (ECC). The encoded expanded write data is written to the block of memory.

Another embodiment is a system for storing data that includes an encoding module configured to communicate with a memory device and to perform a method. The method includes receiving a write request that includes write data. A block of memory in the memory device is identified for storing the write data. The block of memory includes a plurality of pages. A bit error rate (BER) of the block of memory is determined and the expanded write data is created from the write data in response to the BER exceeding a BER threshold. The expanded write data is characterized by an expected BER that is lower than the BER threshold. The expanded write data is encoded using an error correction code (ECC). The encoded expanded write data is written to the block of memory in the memory device.

A further embodiment is a computer program product for storing data. The computer program product includes a tangible storage medium readable by a processing circuit and storing instructions for execution by the processing circuit for performing a method. The method includes receiving a write request that includes write data. A block of memory is identified for storing the write data. The block of memory includes a plurality of pages. A bit error rate (BER) of the block of memory is determined and the expanded write data is created from the write data in response to the BER exceeding a BER threshold. The expanded write data is characterized by an expected BER that is lower than the BER threshold. The expanded write data is encoded using an error correction code (ECC). The encoded expanded write data is written to the block of memory.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 5 illustrates a set of test patterns in accordance with an embodiment;

DETAILED DESCRIPTION

Figure 1:
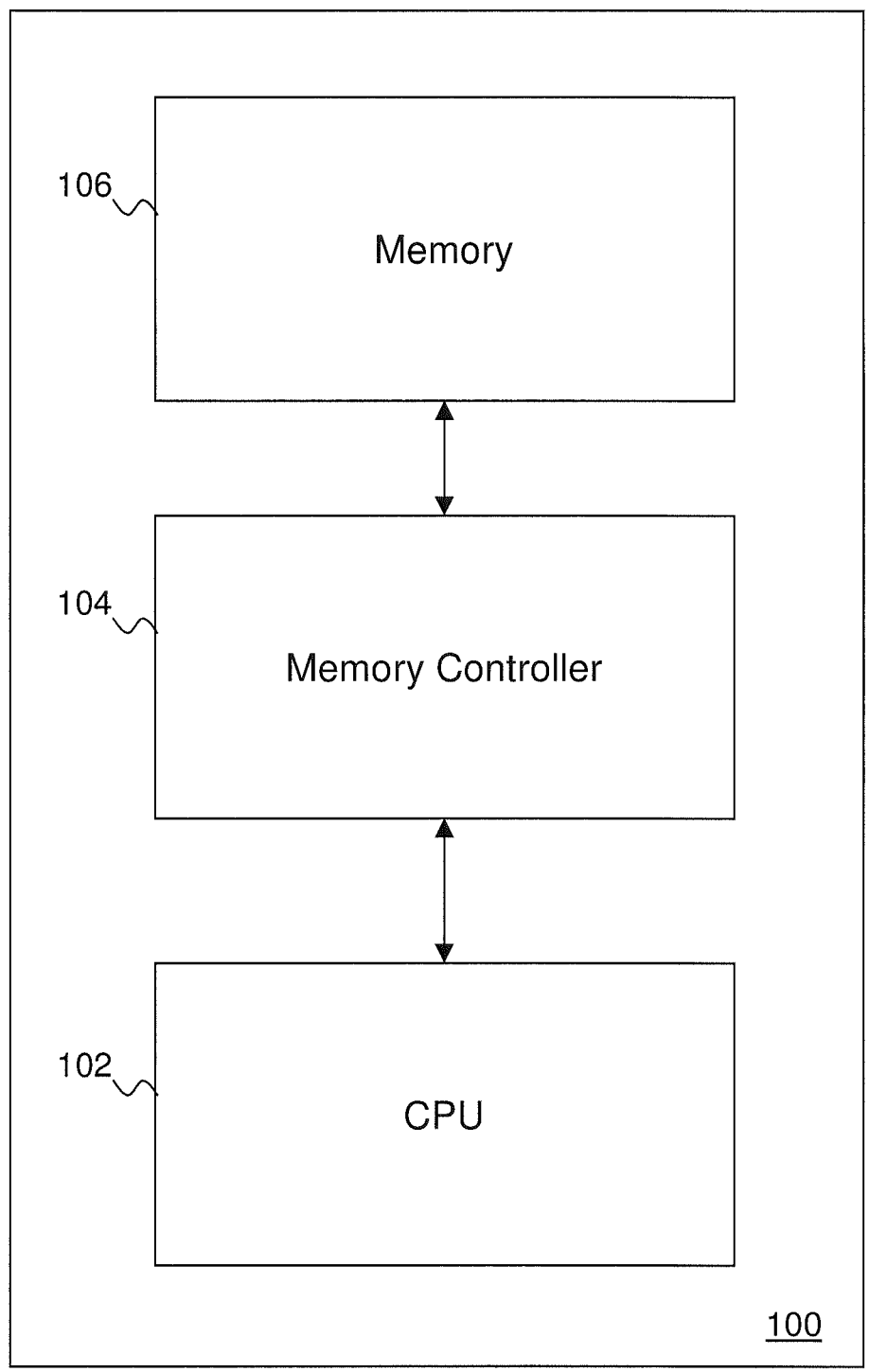
FIG. 1 illustrates a block diagram of a system for storing and retrieving data in a memory in accordance with an embodiment.

An embodiment is directed to improving the reliability and increasing the useful life of not-and (NAND) flash memories. NAND flash memories are a popular class of non-volatile memories that are being used increasingly in a diverse set of storage systems, from enterprise storage servers, to portable electronic systems. The main advantages of such memories are their low cost and high density. On the other hand, they may suffer from a lack of endurance, as well as the existence of certain types of errors which detract from reliability and whose negative effects become more prominent with wear. The rate of error occurrences in NAND flash memories, termed the bit error rate (BER), increases over time. The amount and frequency of the bit errors is dependent on both the age of the memory and the specific data that is written to a memory block.

The main shortcoming of conventional methods, where bad blocks are decommissioned and/or replaced with spare blocks, is that they discard the block completely and are thus wasteful. In accordance with an embodiment described herein, a bad block is used with reduced performance and/or capacity instead of being discarded completely. Such an approach makes more efficient use of the memory. In addition, this approach prolongs the time that a memory is usable, by ensuring that a minimum capacity threshold is maintained for a longer period of time. In one embodiment, the data that is to be written to a memory block with a BER rate higher than what is typically acceptable is expanded using an expansion operation that shapes the data to account for and minimize errors caused by a high BER rate. The expansion is increased as the BER rate of the memory block increases, thereby further extending the life of the memory.

The BER rate is dependent on the data written to the block, therefore various algorithms for implementing data expansion operations are implemented based on the data. For example in a single-level cell (SLC) device, the presence of a large number of zeros (programmed levels) may cause larger bit-line disturb and thus a higher BER. On the other hand using a large numbers of ones (erased levels) to encode data may cause a significantly smaller BER. A worn block may thus have an unacceptably high BER when encoded using pseudo-random data, but may still be usable if encoded with an expanded data pattern. In one embodiment the data pattern written to a block is tailored to the wear of the block. For worn out blocks, a coding is used which sacrifices capacity and/or performance by creating expanded write data (e.g., expanding a page of data to fill out multiple pages). By doing such an expansion operation, a distribution of cell-levels is achieved such that the block has an expected BER that is acceptably low.

If the BER of a block is high, the determined distribution of the write data will be such that a larger expansion of the data will be required to reliably write to the block. If the BER of a block is low, the determined distribution will be such that a small or no expansion of the data is required. Given the write data and the computed level distribution, an embodiment uses enumerative coding to encode the write data into a codeword that has the desired distribution of levels (e.g. of zeros and ones for SLC devices). The enumerative encoded data is then coded using an error correction code (ECC) and written to memory. Data is read from the memory by reversing the coding steps. The determination of a desired distribution of levels may be done jointly with the block-health computation. This may be required for devices such as multi-level cell (MLC) devices where error modes such as floating-gate coupling modes cause a correlation between the distribution selected and the bit-error rate.

FIG. 1 illustrates a block diagram of a system for storing and retrieving data in a memory in accordance with an embodiment. A system 100 depicted in FIG. 1 includes a computer processor 102, a memory 106 having memory cells, and a memory controller 104 for receiving data from the computer processor 102 to be stored in the memory 106. In an embodiment, the memory cells are arranged into pages, and pages are arranged into blocks. Thus, a block may contain a plurality of pages, each page containing a plurality of memory cells.

In one embodiment the memory controller 104 is coupled to the computer processor 102 and receives write requests from the computer processor 102. The write requests contain data to be written to the memory 106 and a logical address for identifying the location in the memory 106 to which the data will be written. The memory controller 104 stores data at a physical address within the memory 106. In an embodiment, the memory controller 104 maps the logic address to a physical address in the memory 106 when storing or retrieving data. The physical address for a given logical address may change each time data in the memory 106 is modified. In one embodiment, the memory 106 is implemented by NAND flash memory devices or other non-volatile memory devices such as, but not limited to: phase change memory (PCM) devices.

The system 100 is one example of a configuration that may be utilized to perform the processing described herein. Although the system 100 has been depicted with only a single memory 106, memory controller 104, and computer processor 102, it will be understood that other embodiments would also operate in other systems with two or more of the memory 106, memory controller 104, or computer processor 102. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
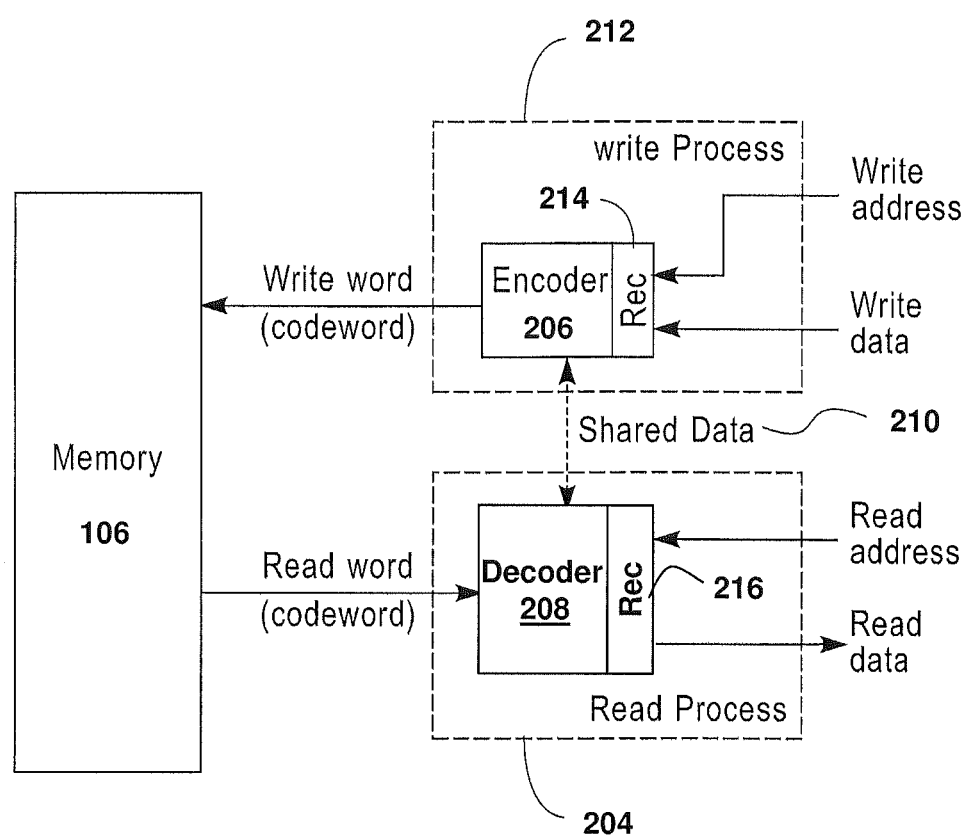
FIG. 2 illustrates a block diagram of a system for encoding and decoding data in a memory in accordance with an embodiment.

FIG. 2 illustrates a block diagram of a system for storing and retrieving data in a memory in accordance with an embodiment. The system depicted in FIG. 2 includes the memory 106 having blocks of memory cells (each block made up of pages), an encoder 206 for receiving write data and generating an expanded and encoded write word for storage in the memory cells. The system also includes a decoder 208 for receiving a read word from the memory 106 and decoding, deflating and generating read data. The system further includes shared data 210 storing characteristics of the stored data for use by both the encoder 206 and the decoder 208 as will be described in more detail below. In an embodiment, the encoder 206 and shared data 210 are utilized by a write process 212, and the decoder 208 and shared data 210 are utilized by a read process 204.

In one embodiment the encoder 206, decoder 208, and shared data 210 are located on a memory controller such as memory controller 104 of FIG. 1, or a memory module. In an alternate embodiment, the encoder 206, decoder 208, and shared data 210 are located on a memory device (not shown) or in a separate encoding or decoding module coupled to the memory controller 104 or the memory 106. The shared data 210 may be stored in a register or any other storage location that is accessible by both the encoder 206 and the decoder 208.

Inputs to the encoder 206 depicted in FIG. 2 include the address of the page to be written (also referred to herein as a "write address"), and the data to be written to the page (also referred to herein as "write data"). As shown in FIG. 2, the inputs are received via a receiver 214 located on the encoder 206. In an embodiment, the inputs are received via a receiver 214 (e.g., located on a memory device, memory module, memory controller, or other location). The receiver 214 may be implemented in a variety of manners including hardware for receiving the inputs and/or a storage location (e.g., a register) where the inputs are located.

An input to the decoder 208 depicted in FIG. 2 includes the address of the memory location (e.g., a page) to be read. In an embodiment, the input is received via a receiver 216 (e.g., located on a memory device, memory module, memory controller, or other location). The receiver 216 may be implemented in a variety of manners including hardware for receiving the inputs and/or a storage location (e.g., a register) where the inputs are located. Although the receivers 214 and 216 are depicted relative to the encoder 206 and decoder 208 respectively, it will be understood that in other embodiments, the receivers 214 and 216 may by located externally to the encoder 206 and the decoder 208. In further embodiments, the receivers 214 and 216 may be physically located in a single module configured to receive both read and write requests.

An output from the decoder 208 depicted in FIG. 2 includes the read data. In an embodiment, the outputting is by a transmitter (e.g., located on a memory device, memory module, memory controller, or other location). The transmitter (not shown) may be implemented in a variety of manners including hardware for transmitting the output and a storage location or register where the outputs are stored. The encoder 206 and decoder 208 are examples of computers that may be utilized to perform the processing described herein.

Figure 3:
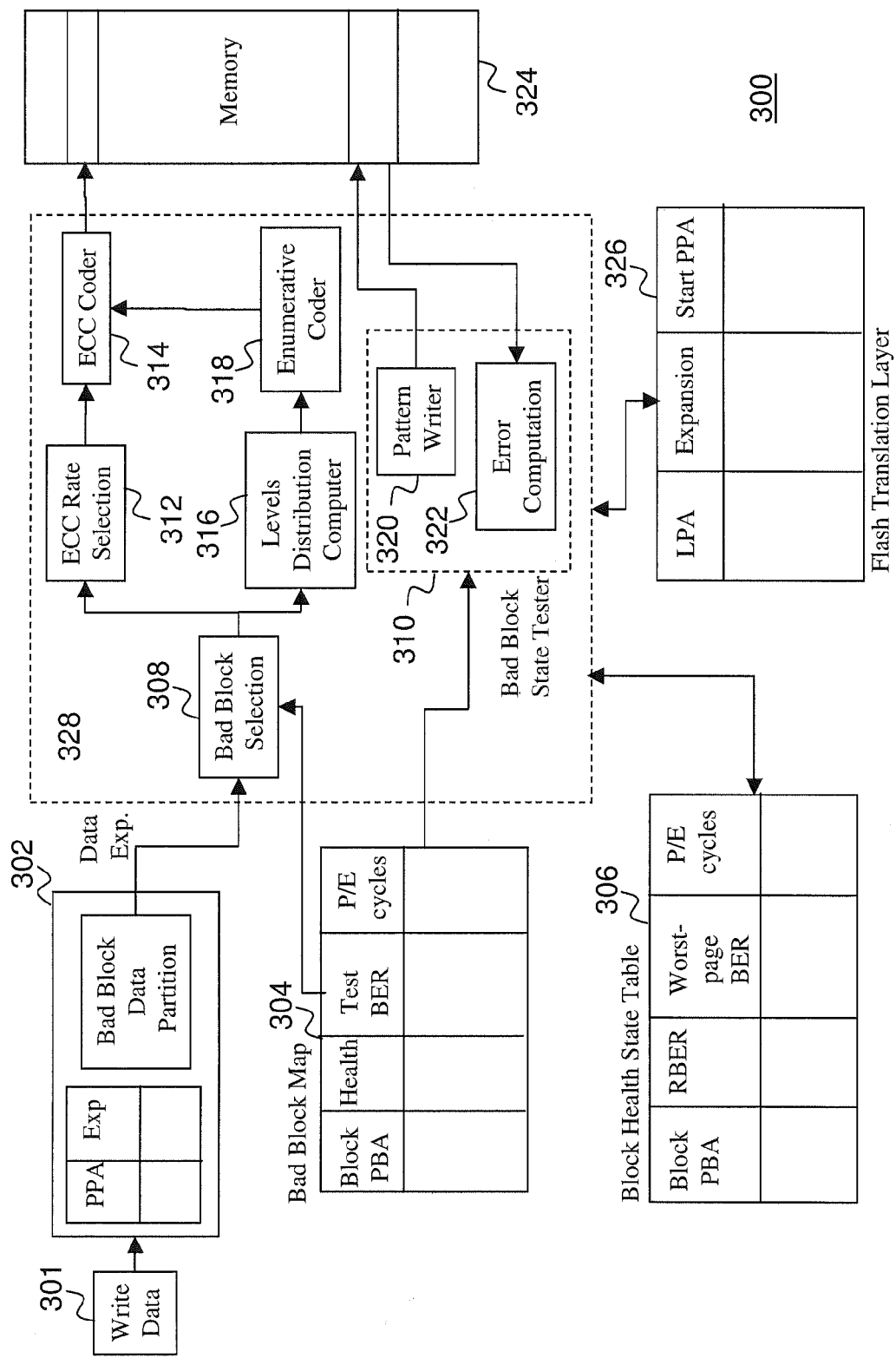
FIG. 3 illustrates a block diagram of a bad block management system in accordance with an embodiment.

FIG. 3 illustrates a block diagram of a system 300 for storing data in a memory in accordance with an embodiment. The system depicted in FIG. 3 includes a memory 324 (e.g. a NAND flash memory) having blocks of memory cells (each block made up of pages), such as the memory 106. In an embodiment, the system 300 includes an encoding module 328 coupled to the memory 324 and to various modules that track bad blocks. As used herein, the term "bad block" refers to a block that has at least one page or page-sector on which the BER exceeds an acceptable threshold on a read. Alternatively, a bad-block can refer to a block on which the average sector or page BER computed over all pages/sectors or a subset of pages/sectors exceeds a threshold. An embodiment can also be used for other types of bad blocks that display unacceptable reliability as measured by other well-known metrics. The encoding module 328 is coupled to a bad block locator module 302 that includes an expansion module for determining how much to expand the data, a physical page address (PPA) module for determining where in the memory 324 to store the data, and a bad block data partition module for tracking blocks of the memory 324 that have exceeded a BER threshold. In an embodiment, the bad block locator module 302 selects a block via a bad block selection module 308. The bad block selection module 308 is coupled to a bad block map module 304 which tracks bad blocks in the memory 324. In one embodiment, the bad block map module 304 tracks block addresses (physical block address or PBA), the health of the block of the memory 324, the latest BER measured from that block of the memory 324, and the number of program and erase cycles (P/E cycles) that have occurred in that block of the memory 324. In additional embodiments, the bad block map tracks fewer pieces of information. In an embodiment, the bad block map module 304 updates the BER for known bad blocks by initiating a block test from a block state tester module 310.

The block state tester module 310 includes a pattern writer module 320, and an error computation module 322. The pattern writer module 320 writes a known pattern to the memory 324 and the error computation module 322 computes the BER based on the pattern that was written to the memory 324 as will be described in more detail below. The computed BER is stored in the bad block map module 304. In one embodiment, the computed BER is stored in a block health status table 306. In one embodiment the health of each block is monitored through the block health status table 306 which contains, for each block, statistics on the BER history, worst-case page BER history, and the number of writes done to the block. Based on these statistics a desirable distribution of levels for data written to the block is determined, and the ECC rate required to ensure reliability is also determined. In one embodiment, the ECC rate has variable levels of error correction, and a higher rate of error correction is selected as the BER increases.

The block health status table 306 stores information relating to blocks of the memory 324. In one embodiment, the block health status table 306 stores the address of each of the bad blocks of memory (block PBA), the average BER across all pages of the bad block of memory (RBER), the BER of the page with the highest BER in the bad block of memory (worst page BER), and the number of program and erase cycles that have occurred in the block of memory (P/E cycles). In an additional embodiment, the computed BER is stored in both the block health state table 306 and the bad block map module 304.

Returning to the bad block selection module 308, in an embodiment where the memory block is a multi-level cell (MLC) memory, once a block in the memory 324 is targeted for writing the data to the memory 324, the data is sent to the levels distribution computing module 316. The levels distribution computing module 316 inspects the data and the BER of the MLC block of the memory 324 in which the data will be stored. The levels distribution computing module 316 then computes the number of occurrences of each MLC level (collectively termed the level-frequency) to be used in the codeword representing the data to be written, and the required number of pages onto which the data will be stored in the MLC block of the memory 324. The computed level-frequency is such that it ensures that the expected BER is lower than an acceptable threshold.

The data and the distribution calculation computed by the levels distribution computing module 316 are received by the enumerative coding module 318. The enumerative coding module 318 transforms the data into a codeword that satisfies the level-frequency computed by levels distribution computing module 316, which are targeted to the specific error conditions existing in the targeted block of the memory 324 so that errors will be within an acceptable threshold. The bad block selection module 308 also sends the data to an ECC rate selection module 312. The ECC rate selection module 312 uses BER information for the block of the memory 324 that the data will be written to in order to calculate the proper ECC encoding level. In one embodiment, the ECC level increases as the BER rate of a block of the memory 324 increases. The data and calculated ECC encoding level is sent to an ECC encoding module 314. The ECC encoding module 314 encodes the data using the ECC level determined in the ECC rate selection module 312. Once the data is encoded it is stored in the memory 324 at the target block. The physical address, and the associated logical address is stored in a flash translation table 326 along with the ECC encoding level and the start physical page address (PPA) of the data written to the memory 324.

Although the system 300 for storing data as described in FIG. 3 depicts a number of components in various relationships for purposes of clarity, it will be understood that the components depicted in FIG. 3 may be arranged in different configurations in other embodiments. In an embodiment, the modules may be implemented in a single hardware component, software component, or a component including both hardware and software. In one embodiment, the data encoding module is located in the memory controller 104 and the bad block locator module 302 is located on a high-level controller such as a RAID controller for distributing data across an array of one or more of the memory 324. In further embodiments, the components depicted in FIG. 3 are in one or more encoding and decoding modules such as the encoder 206 and decoder 208 of FIG. 2. In addition, it will be understood that in one embodiment the bad block state tester module 310 may be omitted and the bad block mapping is be performed when write data is read from the memory 324. In additional embodiments the various modules may be implemented in separate hardware, software, or a combination of hardware and software.

Figure 4:
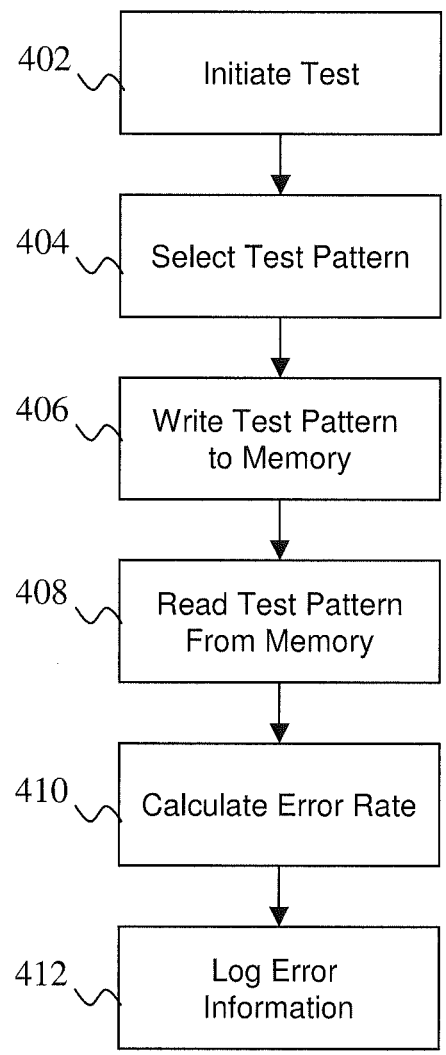
FIG. 4 illustrates a process flow for testing blocks of memory and calculating a bit error rate (BER) in accordance with an embodiment.

FIG. 4 depicts a process flow for determining the BER of a memory such as the memory 324 of FIG. 3. In one embodiment, the BER determination process is executed in the bad block state tester module 310 of FIG. 3. The BER determination process provides a mechanism for determining the BER of a block of a page or block of the memory 324, and storing the BER for use in determining the proper ECC level, level distribution, and data code enumeration for effectively storing data in failing blocks of the memory 324. At block 402 a request to test a block of the memory 324 is initiated. In one embodiment, the bad block map module 304 of FIG. 3 initiates the test request. In another embodiment, the block health status table 306 initiates the test requests. In one embodiment, the test request indicates which block of the memory 324 the bad block state tester module 310 will test (also referred to as the "test block").

In an embodiment, candidate blocks for writing include both non-bad blocks and bad blocks. For example, if a large retention time is needed for a piece of data, that data would get stored in a non-bad block.

In an additional embodiment, the test is initiated automatically in response to a timer interrupt. In an embodiment, the test block is erased before testing. In another embodiment, the data in the test-block is temporarily buffered in other memory while the test is being carried out. At block 404, a test pattern, such as the test patterns 500 and 502 of FIG. 5, are selected for writing to test block. At block 406, the selected pattern is written to the test block. In one embodiment, a pattern is written to each level of an MLC block in the memory 324 such as test pattern 500 of FIG. 5. In an alternate embodiment, a two-dimensional pattern that uses multiple levels of an MLC memory, such as the pattern depicted in 502 of FIG. 5, is written to memory. In another embodiment, data with various fixed level-frequencies is written to the test block. In another embodiment, a known pattern of bits is written to non-MLC memory. At block 406, the test pattern is read out of the test block. At block 410, the data read from the test block is compared to the value written and a BER is calculated. In one embodiment the BER rate is calculated by determining the number of errors in a page of the test block. At block 412, the BER rate is logged for any of the test blocks where errors have been detected. In one embodiment the BER is logged in the bad block map module 304 of FIG. 3. In another embodiment the BER is logged in the block health state table 306 of FIG. 3. In yet another embodiment the BER is logged in both the bad block map module 304 and the block health status table 306.

Figure 6:
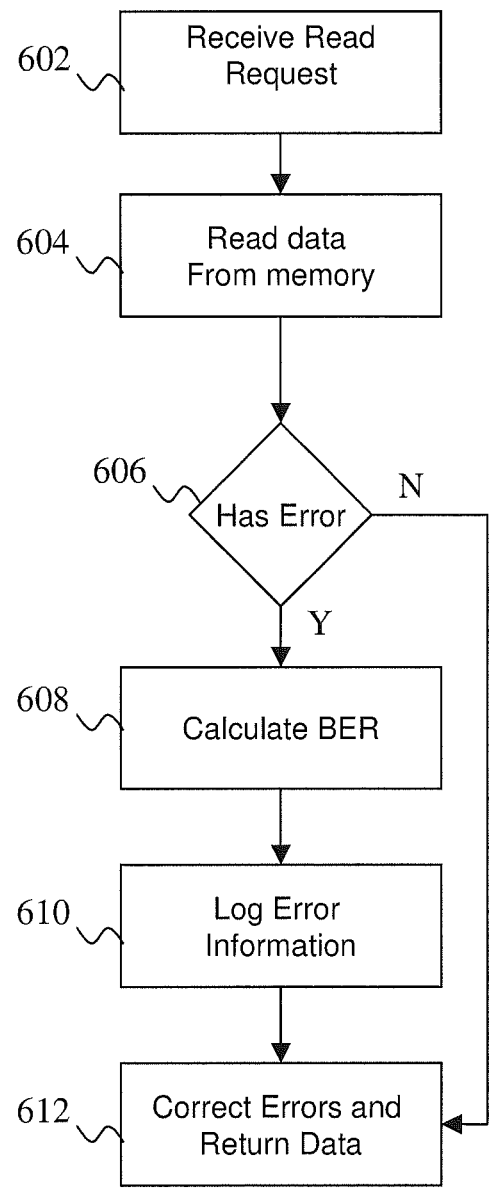
FIG. 6 illustrates a process flow for detecting the BER while reading data in accordance with an embodiment.

FIG. 6 depicts an alternate embodiment for determining the BER of a memory during a retrieval of data from memory such as the memory 324 of FIG. 3. In an embodiment, the process flow of FIG. 6 is executed by a decoder, such as decoder 208 of FIG. 2. At block 602, a request to read data from the memory 324 is received. In one embodiment the request includes the logical address of data in the memory 324. At block 604, the data is read from the memory 324 by mapping the logic address to a physical address. In one embodiment the mapping is performed using data from the flash translation table 326 of FIG. 3. At block 606, the data is inspected to determine if an error occurred in the data. In an embodiment this is done by checking to see if the read data forms a valid codeword of the ECC.

If the read data contains one or more errors, a BER is calculated for the block of the memory 324 based on a statistical model relating to the block's error rate over the entire block. In an embodiment, the number of read errors is computed by correcting the data using ECC decoding and then comparing the read and decoded data. In an embodiment, an existing BER estimate is modified based on the errors observed in the rate, using well-known estimation techniques. At block 612, the BER calculated at block 610 is stored in relationship to the physical address of the memory 324. In one embodiment the BER and block address are stored in a map such as the bad block map module 304 of FIG. 3. In another embodiment, the BER and the block address are stored in a table, such as the block health table 306 of FIG. 3. At block 614, the errors in the data are corrected and the data is returned to the requestor. Returning to block 608, if no error is found in the data it is returned to the requestor at block 614.

Figure 7:
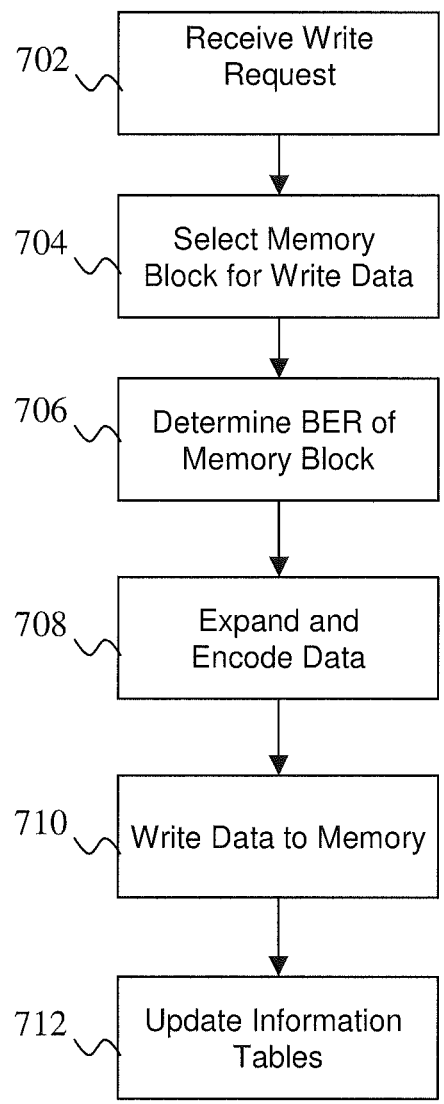
FIG. 7 illustrates a process flow for creating expanded write data and storing data in accordance with an embodiment.

FIG. 7 depicts a process flow for the logging and handling of errors in write data in an additional embodiment. In an embodiment, the processing is performed by encoder 206 of FIG. 2. At block 702, a write request is received. In one embodiment the write request includes write data and a logical memory address where the write data is to be written. At block 704, the bad block selection module 308 of FIG. 3 decides whether to use a bad block to write the data in, and then selects a block of memory to which the data will be written. In an embodiment, the decision whether to use a bad block for writing is based on factors including retention characteristics of the data; for example, data which is 'dynamic' i.e. is expected to be rewritten in a short amount of time (e.g., expected to be retained for a short amount of time), can be written to a bad block with a higher expected BER. At block 706, the BER for the selected block is retrieved from the bad block map module 304 of FIG. 3. At block 708, the write data is expanded using expansion logic and encoded by the levels distribution computing module 316, the enumerative coding module 318 and the ECC encoding module 314 of FIG. 3.

In an embodiment, the error expansion operation is determined by a probability model. The probability model is created by determining the transition probability of a cell based on the values of the eight neighboring cells and the maximum BER of the block that was calculated previously. Thus, the probability model indicates that probability that a target cell will transition from a programmed state to a different state. In an embodiment, the probability model for each cell in a block of memory is calculated and stored in the bad block map module 304 of FIG. 3 every time the BER is calculated. In an alternate embodiment the probability model is calculated each time data is written to a block of memory. The write data is then expanded based on the probability model in order to minimize the probability of an error occurring.

In an embodiment, the expansion process includes adding additional bits to the write data before writing the data to the block of memory. The additional bits are either inconsequential bits (i.e. errors in the bits do not affect the value of the write data), are bits designed to minimize the occurrence of errors thereby creating an expected BER rate that is lower than a BER threshold, or are bits designed to match the condition of error bits, stuck bits for example. In one embodiment, a combination of one or more of the types of expansion bits are used to expand the write data before it is written to the block of memory.

In an alternate embodiment, the error expansion encoding of block 708 is determined on the basis of the error-rate characteristics of the memory device and expanding the write data (to create expanded write data) to reduce the BER to acceptable levels. For example, the more zeros (programmed levels) written to a page of an SLC NAND flash memory 324 the more likely that an error will occur in the page. Therefore, in one embodiment the error expansion encoding will minimize the number of zeros in the block of memory to a maximum threshold. In one embodiment the maximum threshold is tied to a BER so that as the BER increase, the maximum number of zeros allowed in a block of memory is reduced to a maximum zero bit threshold. This reduction in zeros continues as the BER increases. The write data is then expanded in order to reduce the number of zeros written to the block of memory.

In an additional embodiment, the error expansion encoding of block 708 is determined based in the levels of an MLC memory. As the BER of a block of memory increases the probability of an error being created by bit-line disturbances increases. Bit-line disturbance causes a cell value to change when another cell is programmed along the same bit-line. In an MLC NAND flash memory, bit-line disturb is more likely to be caused by high programming levels (corresponding to large floating-gate charge/large threshold voltages) than low programming levels. By expanding the data to create expanded write data in order to eliminate or reduce usage of high programming levels, errors are reduced. The write data is expanded in order to reduce or eliminate writes of high programming levels of the MLC memory block. In one embodiment, the level of the highest level of MLC memory that is written is lowered as the BER increases.

The error expansion encoding discussed above has been described in differing embodiment for purposes of clarity. As would be understood by those of ordinary skill in the art, in varying embodiments, each of the error expansion methods described above may be implemented either alone or in combination within a single system. In one embodiment, the error expansion methods described herein may be used collectively to provide multiple overlapping methods of expansion.

Returning to block 708 of FIG. 7, in an embodiment once the error expansion has been performed on the write data, the expanded write data is encoded using ECC encoding by the ECC encoding module 314. The level of ECC encoding is determined by the ECC rate selection module 312 based on the expected BER of the block of memory, where the computation of the expected BER takes into account data expansion, if any. As the expected BER of the block of memory increases the ECC encoding level also increases in order to compensate for the higher error rates.

At block 710, the expanded and encoded write data is written to memory. At block 712 the flash translation table is updated to indicate the expansion level, encoding level, and the physical starting address of the write data that was stored in memory. In one embodiment, at block 712 the program and erase cycles of the block health state table 306 and the bad block map module 304 of FIG. 3 are updated to indicate an additional program and erase cycle has occurred.

Figure 8:
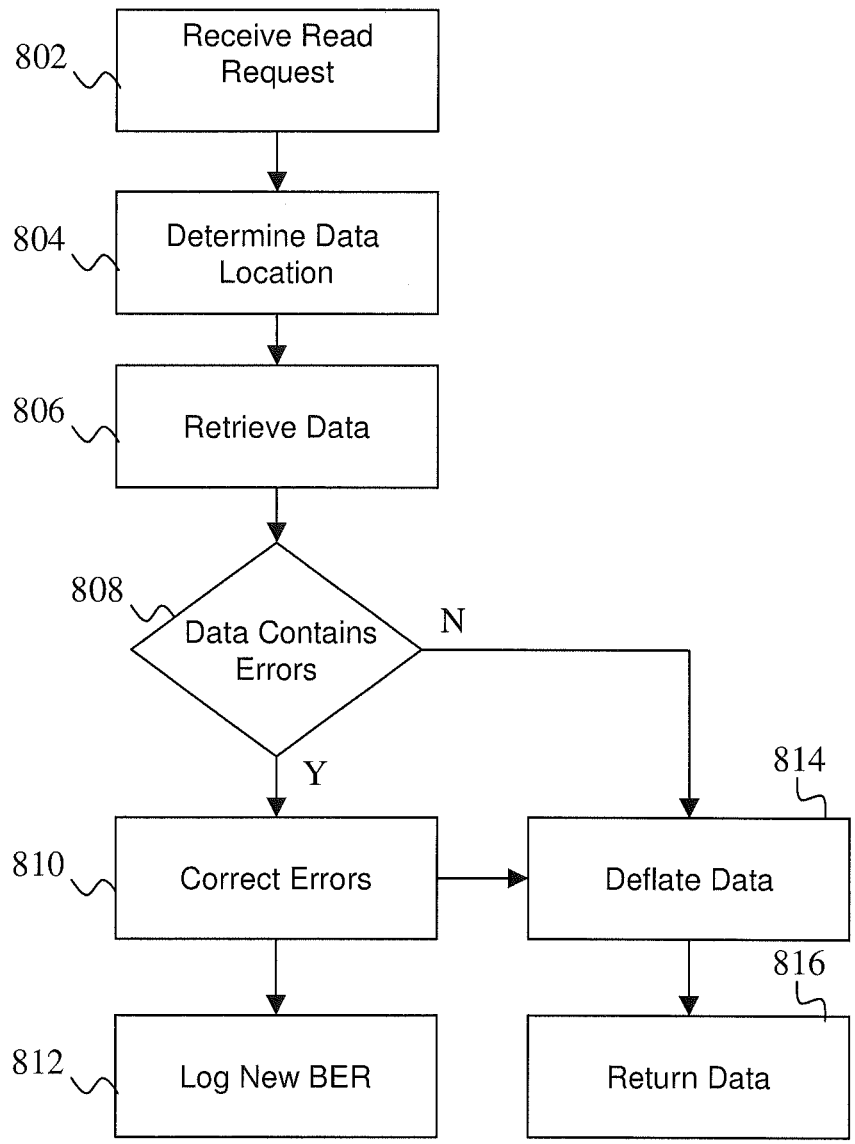
FIG. 8 illustrates a process flow for reading and deflating data in accordance with an embodiment.

FIG. 8 depicts a process flow for the logging and handling of errors in read data in an additional embodiment. In an embodiment, the processing is performed by decoder 208 of FIG. 2. At block 802, a read request is received. In an embodiment, the read request includes a logical memory address from which to read data. At block 804, the data encoding module 328 of FIG. 3 determines the physical location in the memory where the data is stored. In one embodiment the data encoding module 328 retrieves the physical address in the memory that contains the requested data by mapping the logical address received in the read request to a physical address using the flash translation table 326 of FIG. 3. At block 806, the data is retrieved from memory. The starting location and the expansion information stored for the data that was saved in the in the flash translation layer 326 of FIG. 3 at the time the data was written to memory is retrieved and used to determine the starting and ending address range of the data stored in memory. At block 808, ECC is used to determine if any errors were introduced into the data while it was stored in the memory 324. If there were errors in the data, at block 810 the ECC is used to correct the errors. At block 812, the errors are used to update the BER of the block of memory in the bad block map module 304, and the block health state table 306 of FIG. 3. At block 814, the error corrected read data is deflated by the decoder 208 of FIG. 2. The decoding process reverses the expansion process described above. The deflated read data is restored to original data values using the expansion level data previously stored in the flash translation layer 326 along with the address translation information. Once the read data has been deflated it is returned to the requestor at block 816.

Returning to block 808 of FIG. 8, if there were no errors in the read data, the read data is expanded at block 814 and returned to the requester as described above.

Technical effects and benefits include increasing the useful life of NAND flash memory by using blocks of memory with high bit error rates by expanding the data (to create expanded write data) to account for potential errors that may introduced by bad blocks of memory. Such an approach makes more efficient use of the memory; further, it can prolong the time that a memory can be used, by ensuring that a minimum bit error rate can be sustained for an extended period of time.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer implemented method for storing data, the method comprising:
  receiving a write request comprising write data;
  identifying a block of memory in a memory for storing the write data, the block of memory comprising a plurality of pages;
  determining a bit error rate (BER) of the block of memory;
  creating expanded write data from the write data based on the BER exceeding a BER threshold, the expanded write data comprising at least one more bit than the write data and characterized by an expected BER rate that is lower than the BER threshold;
  wherein the creating expanded write data comprises:
  calculating a probability model for a plurality of cells in the block of memory, the probability model indicating a probability that a target cell will transition from a programmed state to a different state based on values stored in a plurality of surrounding cells neighboring the target cell; and adding one or more additional bits to the write data, the one or more additional bits selected to reduce the probability of the transition;

encoding the expanded write data using an error correction code (ECC); and writing the encoded expanded write data to the block of memory.

2. The method of claim 1, wherein the determining the BER of the block of memory comprises:
   writing a known pattern of bits to a target page in the block of memory;
   reading stored bits from the target page;
   comparing the known pattern of bits to the stored bits; and
   determining a number of bits that are different between the known pattern of bits and the stored bits.

3. The method of claim 1, wherein the determining the BER of the block of memory comprises:
   reading read data from the block of memory;
   detecting one or more errors in the read data using the ECC;
   correcting the detected errors using the ECC; and
   determining a number of bits in the read data that are in error in response to the correcting.

4. The method of claim 1, wherein the creating expanded write data comprises encoding the write data with additional bits, the additional bits selected so that the number of bit values in the write data corresponding to a programmed memory cell value is below a threshold.

5. The method of claim 4, wherein the threshold decreases as the BER increases.

6. The method of claim 1, wherein the memory is a multi-level cell (MLC) memory, and the creating expanded write data includes encoding the write data to produce write data for which the number of occurrences of each level is responsive to the determined BER.

7. The method of claim 1, wherein the memory is a MLC memory, and the creating expanded write data includes encoding the write data to produce write data that is stored below specified levels of the MLC memory.

8. The method of claim 1, wherein the ECC comprises one of a plurality of levels of error correction, the level of error correction increasing as the expected BER increases.

9. A system for storing data comprising:
   an encoding module configured to communicate with a memory device and configured to perform a method comprising:
   receiving a write request comprising write data;
   identifying a block of memory in the memory device for storing the write data, the block of memory comprising a plurality of pages;
   determining a bit error rate (BER) of the block of memory;
   creating expanded write data from the write data based on the BER exceeding a BER threshold, the expanded write data comprising at least one more bit than the write data and characterized by an expected BER that is lower than the BER threshold;
   wherein the creating expanded write data comprises:
   calculating a probability model for a plurality of cells in the block of memory, the probability model indicating a probability that a target cell will transition from a programmed state to a different state based on values stored in a plurality of surrounding cells neighboring the target cell; and adding one or more additional bits to the write data, the one or more additional bits selected to reduce the probability of the transition;

encoding the expanded write data using an error correction code (ECC); and writing the encoded expanded write data to the block of memory in the memory device.

10. The system of claim 9, wherein the identifying results in identifying a plurality of candidate blocks of memory for storing the write data, and the method further comprises:
   determining the BER of each of the candidate blocks of memory; and
   selecting one of the candidate blocks of memory in response to the BER of each of the candidate blocks of memory and to data characteristics including an expected time that the write data will be retained before being rewritten, wherein the encoded expanded write data is written to the selected block of memory.

11. The system of claim 9, wherein the determining the BER of the block of memory comprises:
   writing a known pattern of bits to a target page in the block of memory;
   reading stored bits from the target page;
   comparing the known pattern of bits to the stored bits; and
   determining a number of bits that are different between the known pattern of bits and the stored bits.

12. The system of claim 9, wherein the determining the BER of the block of memory comprises:
   reading read data from the block of memory;
   detecting one or more errors in the read data using the ECC;
   correcting the detected errors using the ECC; and
   determining a number of bits in the read data that are in error in response to the correcting.

13. The system of claim 9, wherein the creating expanded write data comprises encoding the write data with additional bits, the additional bits selected so that the number of bit values in the write data corresponding to a programmed memory cell value is below a threshold.

14. The system of claim 9, wherein the memory is a multi-level cell (MLC) memory, and the creating expanded write data includes encoding the write data to produce write data for which the number of occurrences of each level is responsive to the determined BER.

15. The system of claim 9, wherein the ECC comprises one of a plurality of levels of error correction, the level of error correction increasing as the BER increases.

16. A computer program product for storing data, the computer program product comprising:
   a tangible storage medium readable by a processing circuit and storing instructions for execution by the processing circuit for performing a method comprising:
   receiving a write request comprising write data;
   identifying a block of memory in a memory for storing the write data, the block of memory comprising a plurality of pages;
   determining a bit error rate (BER) of the block of memory;
   creating expanded write data from the write data based on the BER exceeding a BER threshold, the expanded write data comprising at least one more bit than the write data and characterized by an expected BER that is lower than the BER threshold;
   wherein the creating expanded write data comprises:
   calculating a probability model for a plurality of cells in the block of memory, the probability model indicating a probability that a target cell will transition from a programmed state to a different state based on values stored in a plurality of surrounding cells neighboring the target cell; and adding one or more additional bits to the write data, the one or more additional bits selected to reduce the probability of the transition;

encoding the expanded write data using an error correction code (ECC); and writing the encoded expanded write data to the block of memory.

17. The computer program product of claim 16, wherein the determining the BER of the block of memory comprises:

writing a known pattern of bits to a target page in the block of memory;

reading stored bits from the target page;

comparing the known pattern of bits to the stored bits; and determining a number of bits that are different between the known pattern of bits and the stored bits.

18. The computer program product of claim 16, wherein the determining the BER of the block of memory comprises:

reading read data from the block of memory;

detecting one or more errors in the read data using the ECC;

correcting the detected errors using the ECC; and determining a number of bits in the read data that are in error in response to the correcting.

19. The computer program product of claim 16, wherein the creating expanded write data comprises encoding the write data with additional bits, the additional bits selected so that the number of bit values in the write data corresponding to a programmed memory cell value is below a threshold.

20. The computer program product of claim 16, wherein the memory is a multi-level cell (MLC) memory, and the creating expanded write data includes encoding the write data to produce write data for which the number of occurrences of each level is responsive to the determined BER.

21. The computer program product of claim 16, wherein the memory is a MLC memory, and the creating expanded write data includes encoding the write data to produce write data that is stored below specified levels of the MLC memory.

22. The computer program product of claim 16, wherein the ECC comprises one of a plurality of levels of error correction, the level of error correction increasing as the expected BER increases.

\* \* \* \* \*